(12) United States Patent
Schneider et al.

(10) Patent No.: US 7,513,777 B2
(45) Date of Patent: Apr. 7, 2009

(54) ELECTRICAL BASE CONNECTION WITH TRANSPARENT CONDUCTIVE LAYER

(75) Inventors: Rolf A. O. Schneider, Rottenburg (DE); Christoph Doeppner, Luetter (DE); Bernd Albrecht, Delligsen (DE); Andreas Nickut, Delligsen (DE)

(73) Assignees: Doeppner Bauelemente GmbH & Co. KG, Grossenlueder (DE); Schneider & Fichtel GmbH, Rottenburg A.N. (DE); Schott AG, Mainz (DE)

( * ) Notice: Subject to any disclaimer, the term of this patent is extended or adjusted under 35 U.S.C. 154(b) by 174 days.

(21) Appl. No.: 11/635,229

(22) Filed: Dec. 7, 2006

(65) Prior Publication Data

US 2007/0139936 A1 Jun. 21, 2007

(30) Foreign Application Priority Data

Dec. 15, 2005 (DE) .................. 20 2005 020 315 U

(51) Int. Cl.
*H01R 12/00* (2006.01)
(52) U.S. Cl. ........................... 439/56; 362/125
(58) Field of Classification Search ............ 439/56, 439/617, 682, 683; 362/125
See application file for complete search history.

(56) References Cited

U.S. PATENT DOCUMENTS

| 1,684,973 | A | * | 9/1928 | Sears ............................ 439/521 |
| 3,469,015 | A |   | 9/1969 | Warren |
| 5,607,225 | A | * | 3/1997 | Halvatzis ..................... 362/125 |
| 6,270,236 | B1 |  | 8/2001 | Brussog |
| 6,942,356 | B1 | * | 9/2005 | Hahn ............................ 362/125 |
| 2005/0020062 | A1 |  | 1/2005 | Caldwell et al. |
| 2006/0099833 | A1 | * | 5/2006 | Mann ............................. 439/63 |

FOREIGN PATENT DOCUMENTS

| DE | 9100936.7 | 5/1991 |
| DE | 40 38 902 A1 | 8/1991 |
| DE | 92 15 662.2 | 3/1993 |
| DE | 198 54 899 C1 | 12/1999 |
| DE | 10 2004 018 109 B3 | 6/2005 |
| EP | 0 900 971 A1 | 3/1999 |
| EP | 0 900 971 B1 | 3/1999 |
| EP | 1 204 306 A2 | 5/2002 |

(Continued)

OTHER PUBLICATIONS

European Patent Office Search Report dated May 22, 2007 (8 pages).

*Primary Examiner*—Tho D Ta
(74) *Attorney, Agent, or Firm*—Flynn, Thiel, Boutell & Tanis, P.C.

(57) ABSTRACT

An electrical socket or base connection is provided on a preferably transparent pane or plate, particularly a base for lighting. The plate is provided with a preferably also transparent, electrically conductive layer. The base connection has an electrically conductive layer, which is subdivided into at least two sections separated from one another by a gap and connected to different poles of an electrical connection. In the vicinity of the separating gap, at least two electrically conductive areas are applied to the electrically conductive layer, and to them are electrically or mechanically connected the base connection. The areas are applied in the form of a layer of electrically conductive material, preferably by screen printing.

10 Claims, 2 Drawing Sheets

FOREIGN PATENT DOCUMENTS

| | | |
|---|---|---|
| GB | 1 212 732 | 11/1970 |
| JP | 5-119706 | 5/1993 |
| JP | 2005-119706 | 5/2005 |
| WO | WO 01/82378 A1 | 11/2001 |
| WO | WO 2004/080712 A1 | 9/2004 |
| WO | WO 2004/095544 A2 | 11/2004 |
| WO | WO 2004/106056 A1 | 12/2004 |

\* cited by examiner

ELECTRICAL BASE CONNECTION WITH TRANSPARENT CONDUCTIVE LAYER

FIELD OF APPLICATION AND PRIOR ART

The invention relates to an electrical socket or base connection to a preferably transparent plate or pane, particularly a base for electrical lighting means. It is known to electrically connect to glass plates light emitting diodes using transparent, electrically conductive layers. WO 2004/080712A1 and WO 2004/106056A1 describe the power supplies. In this case the electrically conductive layer is enclosed between two plates and the associated diodes are at least partly received in recesses of one of the plates. Constructions are also known in which also the diodes are enclosed between the two plates and the power supply takes place via transparent layers.

JP 05-119 706 A and the subsequent EP 900 971 B1 disclose a lighting device having as the support plate a glass plate to which are applied conductors in the form of a thin, electrically conductive, invisible layer. The lighting means are light emitting diodes, which are applied directly to the plate or the conductors located thereon, e.g. by soldering.

PROBLEM AND SOLUTION

The problem of the invention is to provide an electrical base connection with which it is possible to apply to plates provided with an electrically conductive layer other loads and in particular lighting means.

According to the invention the electrically conductive layer is subdivided into at least two sections separated from one another by a gap and connected to different poles of an electrical connection. In the vicinity of the separating gap two electrically conductive areas are applied to the electrically conductive layer, e.g. by screen printing using a silver conducting paste, to which the base or socket is mechanically and electrically connected.

In this way it is possible to achieve a relatively large-area contacting of the electrically conductive layer, which can therefore be made very thin and consequently high-impedance, without in punctiform manner high current densities arising, even when using a low voltage. It is also possible to apply in a preparatory process said fields both in electrically good contacting manner and mechanically strong manner to the plate and therefore also the electrically conductive layer. The subsequent connection of the actual base can then take place mechanically by adhesion or optionally also by soldering or other binding methods and the electrical connection can be carried out conventionally by soldering or other contacting methods, without having to fear any deterioration of the electrically conductive coating.

The areas can be formed in the vicinity of the separating gap between the two electrically conductive layer portions once again as geometrical figures separated by a gap. Semicircular or semicircular ring segments are particularly suitable.

The base can incorporate an electrically non-conductive base plate to which is fixed a holder of a lighting means, e.g. a conventional plug-in base ceramic holder for halogen lamps. A sleeve fixed to the base plate can be used for covering with respect to the outside.

The invention makes it possible to apply, in addition to lighting means, other electrical loads, sensors, controllers and other equipment requiring an electrical connection to plates without visible leads being necessary. These can also be loudspeakers, microcameras, temperature or motion sensors, etc. It is also possible to ensure the power supply alone by means of the electrically conductive layers, whereas other signals, e.g. the image signals of a camera or the switching signals of a contact or proximity sensor are transmitted in wireless manner. It would also be possible to subdivide the layer into three or more sections abutting under the correspondingly subdivided areas. In this way it would be possible to implement more than two connections to the base.

The electrical base connection according to the invention is particularly suitable for the lighting or illumination of glass showcases, etc. If e.g. a base connection is located on the upper top plate of such a showcase in suspended manner, i.e. within said case, then from there there can be an effective illumination of the showcase content. It is possible to make use of a light intensity and/or light-concentrating lighting means, e.g. halogen reflector lamps (spots) or, in order to avoid or reduce heating of the showcase, in the form of multiple light emitting diodes combined in the form of such reflector lamps. They permit a much more effective and efficient illumination of the displayed objects than would be possible with single diodes.

The power supply to the conductive layers, i.e. to the corresponding plate, can take place via the corners. It would also be possible to apply there electrically conductive areas, e.g. using screen printing, to which thin wires are soldered and run down the edges of the plates forming the showcase and in this way are virtually invisible. However, it is also possible to provide some of the lateral plates of such a case with electrically conductive layers and to bring them into contact with those of the plate carrying the base connection.

With such a showcase the advantage exists that the electrically conductive layers are on the inside, so that they are protected against contact or damage. However, it is also possible to provide the electrically conductive layer, with the exception of its contact points, with a seal or e.g. transparent coating in order to protect the same.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

An embodiment of the invention is described in greater detail hereinafter relative to the drawings, wherein show.

DETAILED DESCRIPTION OF AN EMBODIMENT

Figure 1:
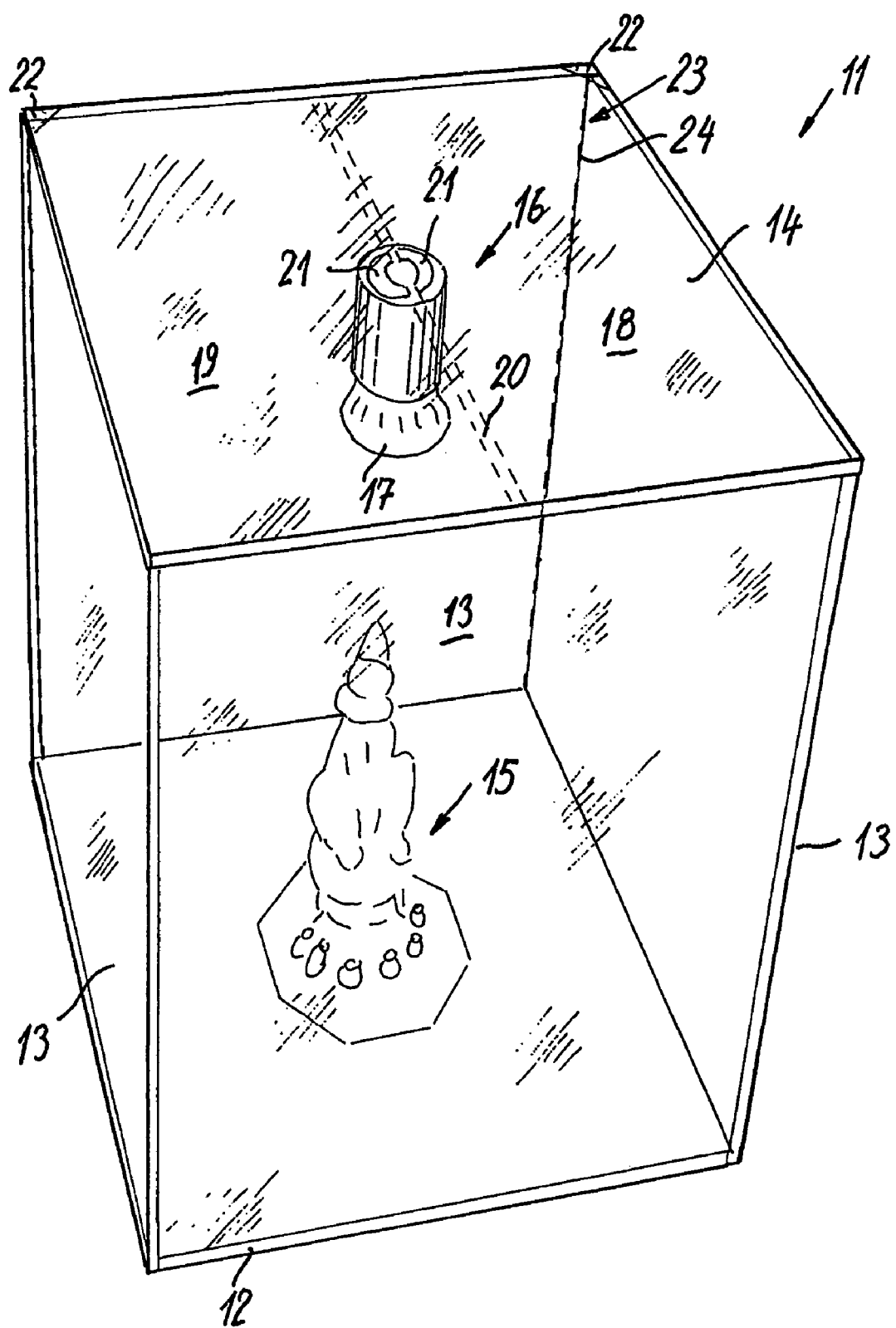
FIG. 1 A perspective view of a showcase with the electrical base connection on the upper top plate.

FIG. 1 shows a glass showcase 11, which has a bottom plate 12 made from a random material, four lateral plates 13 made from glass or some other transparent material and a top plate 14, which is connected to the lateral plates and upwardly terminates the showcase. A display object 15 is shown on the bottom plate of the showcase.

Centrally on its underside, i.e. within the showcase, the top plate 14 carries an electrical socket or base connection 16 for a lighting means 17. The base connection is fitted to the plate or pane 14 without any visible electric leads and therefore appears in the eyes of the observer to float over the display object.

The electrical supply to the base connection takes place by means of a transparent and therefore invisible layer on the underside of plate 14. Said layer is subdivided into two sections 18, 19 by an uncoated or electrically insulating separating gap 20. FIG. 1 shows that said gap runs centrally and also centrally with respect to the base connection in linear manner over the plate and in the embodiment shown parallel to two of the lateral edges of plate 14. However, it could also run diagonally or in other directions. The separating gap can be as narrow as is possible through the manufacturing process, particularly when working with a low electric voltage. Except at the contact points, the layer can be provided with a transparent seal via coating in order to protect against contact from the inside and e.g. to avoid short circuits through moisture (misting).

Electrical contacting of the base connection 16 takes place in the vicinity of areas 21 made from electrically conductive material, e.g. a silver paste applied by screen printing to the electrically conductive sections 18, 19 of the layer, in each case adjacent to the gap 20, followed by curing. They permit a very strong, good contacting hold on the layer. The electrically conductive layer 18, 19 can be made from different known materials and applied using conventional processes. This is e.g. described in detail in JP 05-119706 A (published on 18.5.1993). It can be an indium—tin oxide layer (ITO) applied by vapour deposition, sputtering, etc. Excellently conducting layers are also obtained through the application of thin metal films, e.g. a thin, transparent gold film.

The areas 21 applied to layer 18, 19 and in the embodiment shown the areas 22 applied to the rear corners of plate 14 are used for the electrical connection of layers 18,19 to the base connection and to thin connecting wires 24 located in the rear abutting edges 23 between the lateral plates 13. As a result of their path between the glass edges they are on the one hand virtually invisible as a result of reflection and on the other require no electrical insulation.

The areas 21, 22 provide a very large-area contacting of layer sections 18, 19, which can therefore be made in very thin, high-impedance form, without the current density becoming excessive at any point. The areas 21 on the base connection are semicircular or semicircular ring-shaped, in order to allow introduction into the circular basic shape of the base and form between them a separating gap.

Figure 2:
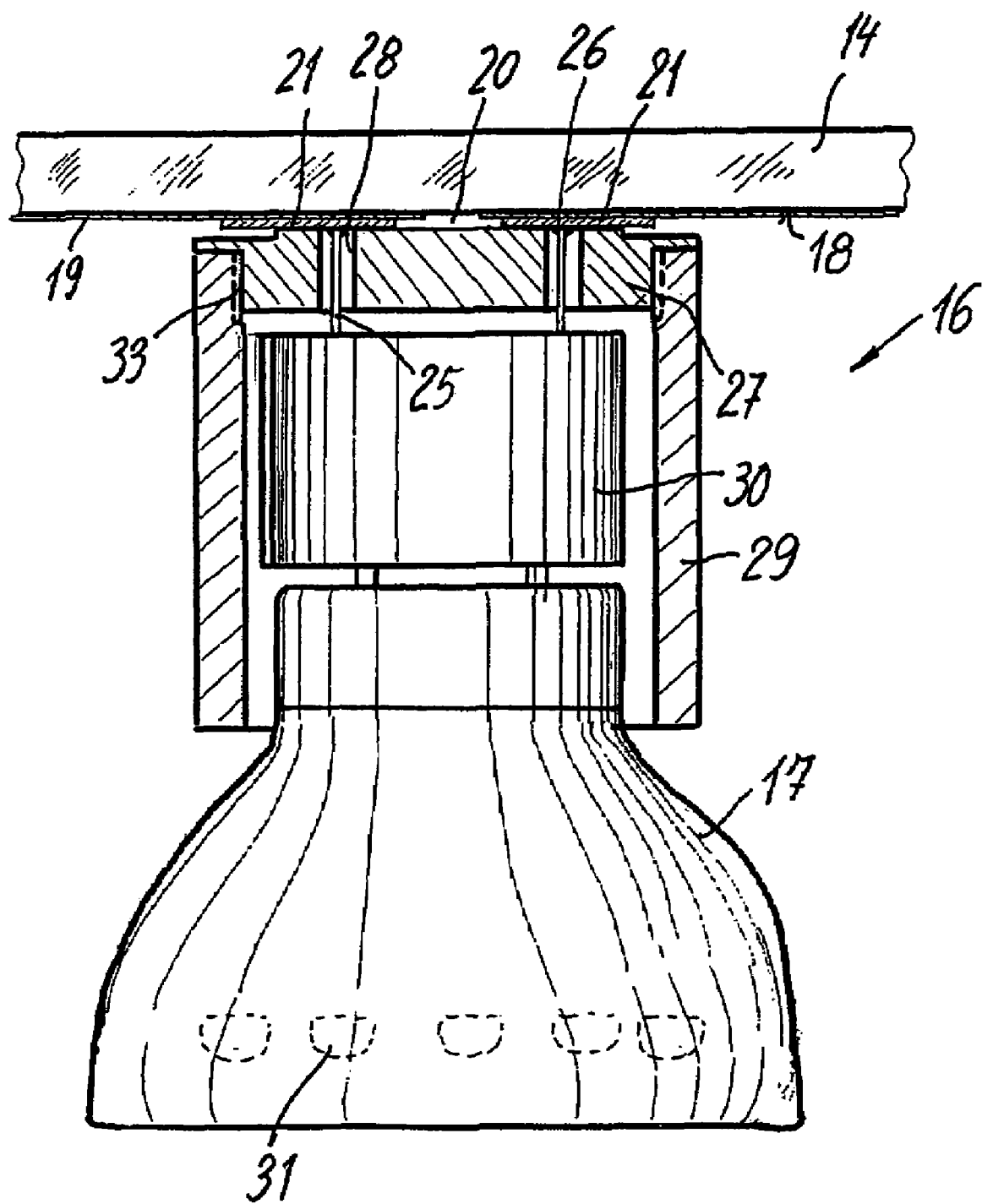
FIG. 2 A partial longitudinal section through the base connection.

FIG. 2 shows the base in part longitudinal sectional, enlarged form. It is possible to see on the underside of plate 14 the two sections 18, 19 of the electrically conductive, transparent layer, as well as the areas 21 applied by screen printing on either side of the separating gap 20 between layer sections 18, 19, to which are soldered connecting wires 25. Over said wires is engaged a base member 27, which is made from a non-conductive material, preferably plastic and which receives the wires in openings 28. The top of the base plate facing plate 14 is soldered by means of an electrically non-conductive adhesive to the underside of areas 21. A flange of the base set back somewhat with respect to said adhesive surface creates a space so that excess adhesive can be introduced into the same. On the outer circumference of the circular base plate 27 is provided a thread 33 onto which can be screwed a sleeve 29. In the space created by the sleeve is located a holder 30, e.g. a ceramic plug-in base holder, such as is normally used for halogen lamps. Into the latter is introduced lighting means 17, which comprises a halogen lamp or, as indicated here, a lamp equipped with a plurality of light emitting diodes 31, which emits an energy-saving light which generates little heat and which is directed through the internal reflector of the lamp in the manner of a spot onto the display object 15.

It is clear that the invention creates the possibility of essentially allowing to "float" a lighting unit or some other electrical device without any apparent leads on or under a transparent plate, which can be made from glass or other transparent materials. In the case of a showcase, like that shown in FIG. 1, it is possible to observe the display object from all sides without any covering or reduction of vision. The power supply, which in the case of low voltage generally also incorporates a transformer, can be fitted below the bottom plate 12 or at a random other point. The fitting of the base connection to the uninterrupted surface of the plate offers the advantage of uncomplicated manufacture and better optics. However, it would also be possible to have in the base region a depression, e.g. a milled slot, into which the base projects. The electrical connection can still take place by means of the areas applied to the conductive layer.

The invention claimed is:

1. Electrical base connection on a first transparent plate, the plate being provided with a transparent, electrically conductive layer, wherein the electrically conductive layer is subdivided into at least two sections separated from one another by a separating gap and connected to different poles of an electrical connection and wherein in the vicinity of the gap at least two electrically conductive areas are applied to the electrically conductive layer and to which the base connection is electrically or mechanically connected, wherein the first transparent plate is part of a case comprising several transparent plates, the electrical connection running in the form of thin wires in at least one gap between edges of the several transparent plates or the electrical connection to the first transparent plate takes place by means of also electrically conducting, coated, adjacent plates.

2. Base connection according to claim 1, wherein the electrically conductive areas are applied in the form of a layer of electrically conductive material, by screen printing.

3. Base connection according to claim 1, wherein the electrically conductive areas are in the form of geometrical figures, particularly semicircular or semicircular ring segments separated by a gap.

4. Base connection according to claim 1, wherein connecting wires of the base connection are soldered to the electrically conductive areas.

5. Base connection according to claim 1, wherein the base connection is bonded to the electrically conductive areas.

6. Base connection according to claim 1, further comprising an electrically non-conducting base member, a holder for a lighting means and a sleeve embracing the holder and fixed to the base member.

7. Base connection according to claim 1, wherein the base connection is fitted to the underside of a top plate.

8. Base connection according to claim 1, wherein the base connection is provided with an energy-saving lighting means, particularly a single or multiple diode lighting unit.

9. Base connection according to claim 1, wherein the electrically conductive areas are contacted with an electrical connection at at least one of their edges or corners.

10. Base connection according to claim 9, wherein contacting takes place by means of electrically conducting areas applied in layer form.

* * * * *